United States Patent
Cheng

(10) Patent No.: US 10,620,958 B1
(45) Date of Patent: Apr. 14, 2020

(54) CROSSBAR BETWEEN CLIENTS AND A CACHE

(71) Applicant: Advanced Micro Devices, Inc., Santa Clara, CA (US)

(72) Inventor: Xianwen Cheng, Oviedo, FL (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/208,010

(22) Filed: Dec. 3, 2018

(51) Int. Cl.
| G06F 9/38 | (2018.01) |
| G06F 15/80 | (2006.01) |
| H03K 19/00 | (2006.01) |
| G06F 13/40 | (2006.01) |
| G06F 13/16 | (2006.01) |
| G06F 1/3203 | (2019.01) |

(52) U.S. Cl.
CPC .......... *G06F 9/3814* (2013.01); *G06F 1/3203* (2013.01); *G06F 9/383* (2013.01); *G06F 9/3887* (2013.01); *G06F 13/16* (2013.01); *G06F 13/4022* (2013.01); *G06F 15/8007* (2013.01); *H03K 19/0008* (2013.01)

(58) Field of Classification Search
None
See application file for complete search history.

(56) References Cited

U.S. PATENT DOCUMENTS

| 5,553,223 A | 9/1996 | Greenlee et al. |
| 5,706,502 A | 1/1998 | Foley et al. |
| 5,761,513 A | 6/1998 | Yellin et al. |
| 5,815,653 A | 9/1998 | You et al. |
| 5,923,885 A | 7/1999 | Johnson et al. |
| 6,058,393 A | 5/2000 | Meier et al. |

(Continued)

FOREIGN PATENT DOCUMENTS

| KR | 100255510 B1 * | 5/2000 | ......... G06F 12/0855 |
| WO | 96/38791 A1 | 12/1996 | |
| WO | WO-2007072435 A2 * | 6/2007 | ........... G06F 12/023 |

OTHER PUBLICATIONS

'Architectural Techniques for Improving the Power Consumption of NoC-Based CMPs: A Case Study of Cache and Network Layer' by Ofori-Attah et al., Journal of Low Power Electronics and Applications, 2017. (Year: 2017).*

(Continued)

*Primary Examiner* — Steven G Snyder
(74) *Attorney, Agent, or Firm* — Kowert Hood Munyon Rankin and Goetzel PC; Rory D. Rankin

(57) ABSTRACT

Systems, apparatuses, and methods for efficiently reducing power consumption in a crossbar of a computing system are disclosed. A data transfer crossbar uses a first interface for receiving data fetched from a data storage device that is partitioned into multiple banks. The crossbar uses a second interface for sending data fetched from the multiple banks to multiple compute units. Logic in the crossbar selects data from a most recent fetch operation for a given compute unit when the logic determines the given compute unit is an inactive compute unit for which no data is being fetched. The logic sends via the second interface the selected data for the given compute unit. Therefore, when the given compute unit is inactive, the data lines for the fetched data do not transition for each inactive clock cycle after the most recent active clock cycle.

20 Claims, 5 Drawing Sheets

(56) References Cited

U.S. PATENT DOCUMENTS

| | | | |
|---|---|---|---|
| 6,119,247 A | | 9/2000 | House et al. |
| 6,138,140 A | | 10/2000 | Yokote |
| 6,185,703 B1 | * | 2/2001 | Guddat ................. G11C 29/48 |
| | | | 711/3 |
| 6,522,189 B1 | * | 2/2003 | Do .......................... G11C 8/12 |
| | | | 326/115 |
| 6,618,854 B1 | | 9/2003 | Mann |
| 6,895,482 B1 | * | 5/2005 | Blackmon ............. G06F 9/3824 |
| | | | 710/112 |
| 7,154,300 B2 | * | 12/2006 | Anders ............... H04L 25/0278 |
| | | | 326/86 |
| 7,369,449 B2 | * | 5/2008 | Tsunetou ................. G11C 7/02 |
| | | | 365/189.04 |
| 7,694,077 B2 | * | 4/2010 | Hironaka ............. G06F 9/3802 |
| | | | 365/230.05 |
| 7,873,812 B1 | | 1/2011 | Mimar |
| 8,359,421 B2 | * | 1/2013 | Wang ................. G06F 13/1663 |
| | | | 710/317 |
| 8,914,613 B2 | | 12/2014 | Sperber et al. |
| 9,430,411 B2 | * | 8/2016 | Lin .......................... G06F 12/00 |
| 9,933,841 B2 | * | 4/2018 | Sideris ............... G06F 9/30181 |
| 9,971,700 B2 | | 5/2018 | Loh |
| 9,983,652 B2 | | 5/2018 | Piga et al. |
| 10,108,249 B2 | * | 10/2018 | Seki ...................... G06F 1/3225 |
| 2003/0062944 A1 | * | 4/2003 | Do .......................... G11C 8/12 |
| | | | 327/407 |
| 2004/0054877 A1 | | 3/2004 | Macy, Jr. et al. |
| 2004/0088489 A1 | * | 5/2004 | Hironaka ............. G06F 9/3802 |
| | | | 711/131 |
| 2004/0225840 A1 | * | 11/2004 | O'Connor ............. G06F 9/3001 |
| | | | 711/122 |
| 2005/0146357 A1 | * | 7/2005 | Anders ............... H04L 25/0278 |
| | | | 326/86 |
| 2006/0018179 A1 | * | 1/2006 | Marchal ................. G06F 8/4432 |
| | | | 365/230.03 |
| 2007/0140021 A1 | * | 6/2007 | Tsunetou ................. G11C 7/02 |
| | | | 365/189.07 |
| 2007/0250683 A1 | | 10/2007 | Van Hook et al. |
| 2008/0126750 A1 | | 5/2008 | Sistla |
| 2008/0222360 A1 | * | 9/2008 | Hironaka ............. G06F 9/3802 |
| | | | 711/125 |
| 2008/0313482 A1 | * | 12/2008 | Karlapalem .......... G06F 12/023 |
| | | | 713/324 |
| 2011/0035529 A1 | * | 2/2011 | Wang ................. G06F 13/1663 |
| | | | 710/317 |
| 2011/0119526 A1 | | 5/2011 | Blumrich et al. |
| 2011/0219208 A1 | | 9/2011 | Asaad et al. |
| 2014/0189311 A1 | | 7/2014 | Roussel et al. |
| 2014/0192583 A1 | | 7/2014 | Rajan et al. |
| 2014/0298056 A1 | * | 10/2014 | Seki ...................... G06F 1/3225 |
| | | | 713/320 |
| 2015/0012724 A1 | | 1/2015 | Lutz et al. |
| 2015/0120978 A1 | | 4/2015 | Kalyanasundharam et al. |
| 2015/0301827 A1 | * | 10/2015 | Sideris ............... G06F 9/30181 |
| | | | 712/226 |
| 2018/0285315 A1 | * | 10/2018 | Ray ...................... G06F 15/8007 |
| 2019/0004814 A1 | | 1/2019 | Chen et al. |

OTHER PUBLICATIONS

'Data-Transformation Algorithms for Minimizing Bit Flips on GPU Data Buses' by Arthi Nagarajan, Thesis, Aug. 2017. (Year: 2017).*

'Distance-Based Recent Use (DRU): An Enhancement to Instruction Cache Replacement Policies for Transition Energy Reduction' by Praveen Kalla et al., IEEE Transactions on Very Large Scale Integration (VLSI) Systems, vol. 14, No. 1, Jan. 2006. (Year: 2006).*

'A DVS-based Pipelined Reconfigurable Instruction Memory' by Zhiguo Ge et al., Copyright 2009 ACM. (Year: 2009).*

'Near-memory Caching for Improved Energy Consumption' by Nevine AbouGhazaleh et al., 2005 International Conference on Computer Design. (Year: 2005).*

Smith et al., U.S. Appl. No. 15/728,191, entitled "Method and Apparatus for In-Band Priority Adjustment Forwarding in a Communication Fabric", filed Oct. 9, 2017, 29 pages.

Tsien et al., U.S. Appl. No. 15/725,912, entitled "Dynamic Control of Multi-Region Fabric", filed Oct. 5, 2017, 29 pages.

Non-Final Office Action in U.S. Appl. No. 15/637,629, dated Sep. 13, 2018, 16 pages.

Final Office Action in U.S. Appl. No. 15/637,629, dated Feb. 26, 2019, 15 pages.

* cited by examiner

CROSSBAR BETWEEN CLIENTS AND A CACHE

BACKGROUND

Description of the Related Art

In computing systems, some types of applications perform functions that are better able to exploit parallel processing and shared memory than other applications. Examples of such applications include machine learning applications, entertainment and real-time applications using video graphics rendering, cryptography, garbage collection as well as some business, scientific, medical and other applications. Compilers extract parallelized tasks from program code to execute in parallel on the system hardware. To increase parallel execution on the hardware, a processor uses multiple parallel execution lanes, such as in a single instruction multiple word (SIMD) micro-architecture. This type of micro-architecture provides higher instruction throughput for particular software applications than a single-lane micro-architecture or a general-purpose micro-architecture.

Whether the processor uses a SIMD micro-architecture or other parallel organization, in some designs, the parallel execution lanes access a segmented data storage device. For example, one or more of an instruction cache and a data cache include multiple banks. Multiple clients access the multi-banked data storage device via a data transfer crossbar (or crossbar). The clients are representative of a variety of types of data processing logic with both combinatorial logic and sequential elements. For example, in some designs, the clients are compute units in a GPU. The multi-banked data storage device uses multiple ports with multiple queues. In many designs, the crossbar is located between the banks of the data storage device and the queues, which the clients access.

Portions of the crossbar are power gated while other portions continue maintaining data transfer functionality. The power-gated portions correspond to inactive clients, or clients that currently are not reading or fetching data from the multi-banked data storage device. When a given compute unit is inactive, the data lines for the fetched data continue transitioning for one or more clock cycles although control signals indicate that the data is invalid. When the data size grows, the power consumption increases even during the power gated clock cycles.

In view of the above, efficient methods and systems for efficiently reducing power consumption in a crossbar of a computing system are desired.

BRIEF DESCRIPTION OF THE DRAWINGS

The advantages of the methods and mechanisms described herein may be better understood by referring to the following description in conjunction with the accompanying drawings, in which.

Figure 1:
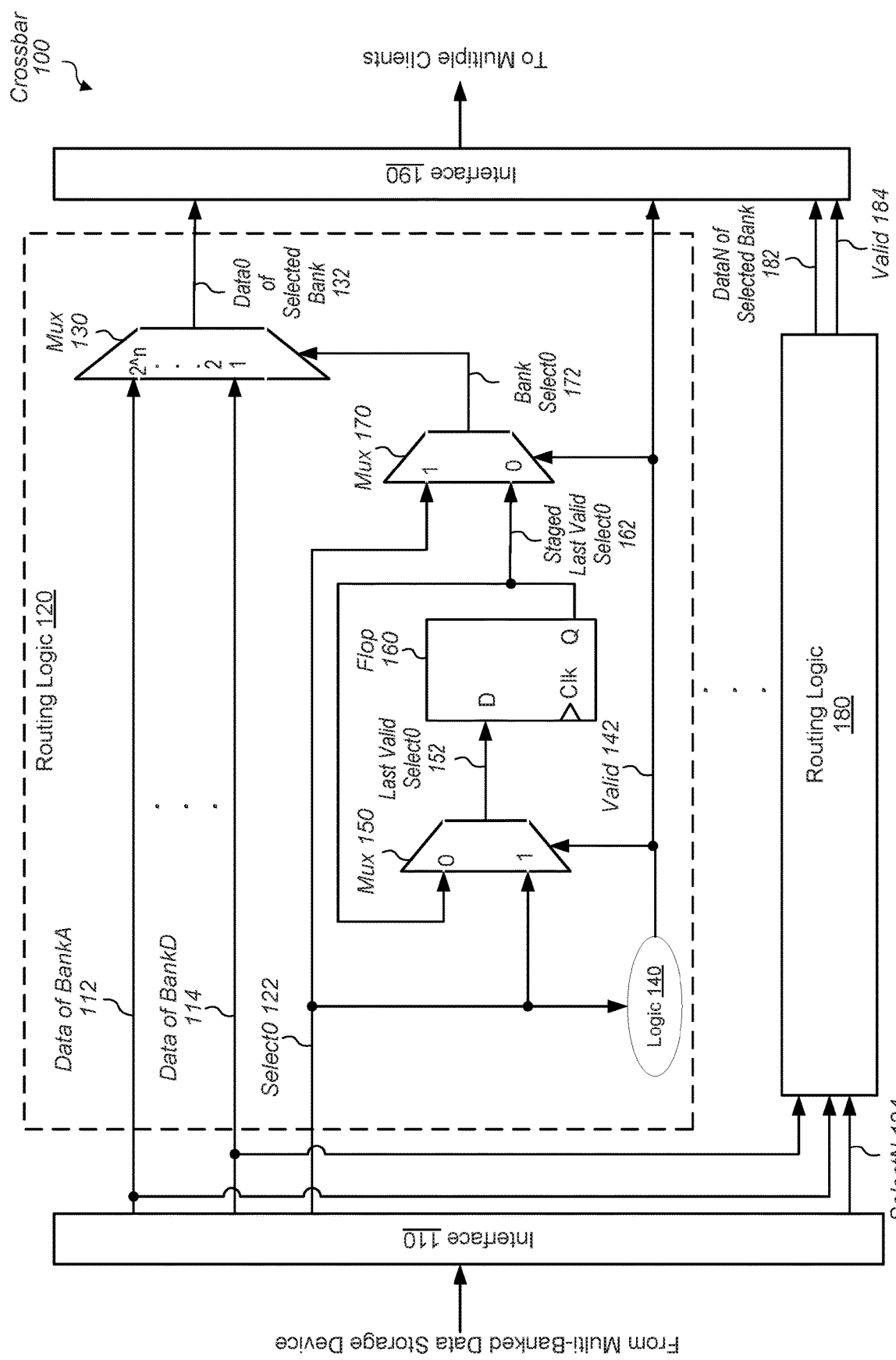
FIG. 1 is a block diagram of one embodiment of a data transfer crossbar.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION OF EMBODIMENTS

In the following description, numerous specific details are set forth to provide a thorough understanding of the methods and mechanisms presented herein. However, one having ordinary skill in the art should recognize that the various embodiments may be practiced without these specific details. In some instances, well-known structures, components, signals, computer program instructions, and techniques have not been shown in detail to avoid obscuring the approaches described herein. It will be appreciated that for simplicity and clarity of illustration, elements shown in the figures have not necessarily been drawn to scale. For example, the dimensions of some of the elements may be exaggerated relative to other elements.

Various systems, apparatuses, methods, and computer-readable mediums for efficiently reducing power consumption in a crossbar of a computing system are disclosed. A data transfer crossbar uses a first interface for receiving data fetched from a data storage device partitioned into multiple banks. Each bank stores data. In some embodiments, the data storage device is an instruction cache and the data are instructions of computer programs. The data transfer crossbar (or crossbar) uses a second interface for sending data fetched from the multiple banks to multiple clients such as compute units. The compute units are representative of a variety of data processing units. In an embodiment, the compute units execute the instructions with accompanying user source data and program result data. In some designs, the compute units are compute units of a parallel data processing unit such as a graphics processing unit (GPU). Each of the multiple compute units share command and data caches in the GPU.

The crossbar additionally includes logic. The logic is implemented in software, in hardware, such as circuitry, or a combination of hardware and software. The logic selects data from a most recent fetch operation for a given compute unit when the logic determines the given compute unit is an inactive compute unit. Generally speaking, an inactive compute unit has no data currently being fetched. The logic sends to the second interface the selected data for the given compute unit. Therefore, when the given compute unit is inactive, the data lines for the fetched data do not transition (i.e., the data lines do not toggle) for each inactive clock cycle after the most recent active clock cycle. In fact, the data lines for the fetched data do not transition for as many clock cycles as the given compute unit remains inactive. Accordingly, the crossbar reduces the power consumption of the computing system.

Referring to FIG. 1, one embodiment of a crossbar 100 is shown. The data transfer crossbar 100 (or crossbar 100) includes interfaces 110 and 190 as well as routing logic 120-180. In many designs, crossbar 100 transfers instructions and data between a multi-banked data storage device and multiple clients. In some designs, each of the multiple clients is capable of requesting data from any one of the multiple banks in the multi-banked data storage device. In some designs, the data storage device is a multi-banked instruction cache, and each client is one of a variety of processing units. For example, in an embodiment, each of the multiple clients is a compute unit in a GPU.

In some designs, interface 110 uses access logic for accessing data in the multi-banked data storage device. In other designs, interface 110 buffers data received from a data storage device controller, which performs the accessing of the multi-banked data storage device. Buffering the received data includes one or more of storing the data in queues and relaying the data through a series of data inverters such as back-to-back inverters. In some embodiments, routing logic 180 includes the same functionality as routing logic 120. In the illustrated embodiment, routing logic 120 uses multiplexers (muxes) 130, 150 and 170. Additionally, routing logic 120 uses sequential element 160, which is one of a variety of sequential storage elements such as a flip-flop circuit, a register and one or more latches. The clock signal for the sequential element 160 is not shown for ease of illustration.

Although two instantiations of routing logic 120 are shown, the crossbar 100 uses any number of instantiations. A respective client uses one of the instantiations 120-180. If there are five clients, then there are five instantiations of routing logic 120. If there are 100 clients, then there are 100 instantiations of routing logic 120. The number of instantiations of each of the components, such as muxes 130-170 and sequential element 160, is based on the data size. For example, when the data size is 265 bits, there are 265 muxes for each single mux shown, and there are 265 sequential elements for the sequential element 160.

Each of the routing logic blocks 120-180 receives from the interface 110 the "data of bank A 112" and the "data of bank D 114." The multi-banked data storage device has any number of banks. Here, data for two banks are shown for ease of illustration. The mux 130 receives the data of bank A 112 and the data of bank D 114, and selects one of the received data to send to interface 190 as data0 of selected bank 132. Similar to interface 110, interface 190 buffers data received from mux 130. Buffering the received data includes one or more of storing the data in queues and relaying the data through a series of data inverters such as back-to-back inverters. Interface 190 sends the selected data to a corresponding client of the multiple clients.

The select lines of mux 130, which are referred to as bank select0 172 are based on the previous stages of logic implemented by muxes 150 and 170 and sequential element 160. As shown, the mux 150 receives the output of the sequential element 160 and the select0 122. Routing logic 120 receives select0 122, whereas the routing logic 180 receives selectN 124. Routing logic 120 generates "data0 of selected bank 132," whereas the routing logic 180 generates "dataN of selected bank 182." These select lines are based on respective clients. For example, client0 uses routing logic 120 and clientN uses routing logic 180.

In some embodiments, the clients decide which bank of the multi-banked data storage device stores desired data. In an embodiment, the clients insert a bank identifier in the data request, and sends the data request to the data storage device. For example, if client0 requests data from bank 2, then client0 inserts the bank identifier 2 in the data request. When the data storage device services the data request and sends the desired data to client0, select0 122 has the value 2. In other embodiments, an address sent in a data request from client0 is mapped by the data storage device to bank 2. For example, a controller for the data storage device maintains an address mapping table that maps a given address space to a particular bank. When client0 requests data from address 0x100 where "0x" denotes a hexadecimal value, the data storage device maps address 0x100 to bank 2. Again, when the data storage device services the data request and sends the desired data to client0, select0 122 has the value 2.

In each of these examples, client0 has an active status. In various embodiments, when client0 has an inactive status, one or more of the data storage device and the crossbar 100 are notified. For example, a power management unit sends an indication to one or more of the data storage device and the crossbar 100 specifying that client0 is transitioning from an active status to an inactive status. Alternatively, client0 sends the indication prior to entering the inactive status. Based on being aware that client0 is inactive, one or more of the data storage device and the crossbar 100 generates a value for select0 122 that indicates the inactive status of client0 while also not identifying any bank in the data storage device. For example, when the banks in the data storage device have indexes 1 to 4, control logic uses the value 0 to indicate that client0 is inactive.

In some designs, the selects lines for the mux 130 use a one-hot mask. In one example, the data storage device has four banks with indexes 1, 2, 4 and 8. When client0 is active, control logic in one of the data storage device and the crossbar 100 generates one of these four indexes for select0 122. However, when client0 is power gated, or otherwise powered down or inactive, the value 0 is used for select0 122 to indicate the inactive status for client0. Therefore, in some designs, the logic 140 includes Boolean OR logic. If any bit of the mask for select0 122 has a Boolean logic high value, such as a binary one, then logic 140 generates a Boolean logic high value for its output, which is valid 142. In contrast, if all of the bits of the mask for select0 122 has a Boolean logic low value, such as a binary zero, then logic 140 generates a Boolean logic low value for valid 142. It is noted that when client0 is active, bank select0 172 matches select0 122. It is also noted that mux 130 does not receive the value that indicates that client0 is inactive regardless of whether client0 is active or inactive. For example, mux 130 does not receive the value 0 regardless of whether client0 is active or inactive. Therefore, mux 130 only receives a value that identifies one of the banks in the data storage device despite that control logic generates the value 0 for select0 122 when client0 is inactive.

In the illustrated embodiment, based on valid 142, mux 150 selects between the received input select0 122 and the output of the sequential element 160, which is staged most recent valid select 162. The sequential element 160 receives the output of mux 150, which is most recent valid select0 152. Therefore, when client0 is inactive, valid 142 has a Boolean logic low value, and sequential element 160 recycles its contents. The recycled contents is the value of select0 122 during the most recent clock cycle when client0 was active. Therefore, if client0 requested data from bank 8 during its most recent active clock cycle, then sequential element 160 stores and recycles a one-hot mask value with the value 8. For example, the single Boolean logic high value in the mask is stored in the bit position that indicates bank 8. When client0 is active, valid 142 has a Boolean logic high value, and sequential element 160 stores new data each clock cycle while client0 is active.

Similar to mux 150, mux 170 receives valid 142 on its select lines. It is noted that the inputs for mux 170 are switched in relation to the order of inputs for mux 150. Again, when client0 is inactive, valid 142 has a Boolean logic low value, and mux 170 selects the output of the sequential element 160. Therefore, the value of select0 122 during the most recent clock cycle when client0 was active is sent to mux 130. If client0 requested data from "bank A" during its most recent active clock cycle, then the data0 of selected bank 132 does not transition and it is selected by mux 130. Accordingly, the data on each of data of bank A 112 and data0 of selected bank 132 also does not transition. For each clock cycle that client0 is inactive, the data on each of data of bank A 112 and data0 of selected bank 132 does not transition. When client0 is active, valid 142 has a Boolean logic high value, and mux 130 selects the data corresponding to one of the inputs 112-114. In a similar manner, routing logic 180 generates the output "dataN of selected bank 182." Additionally, routing logic 180 generates the output valid 184.

Figure 2:
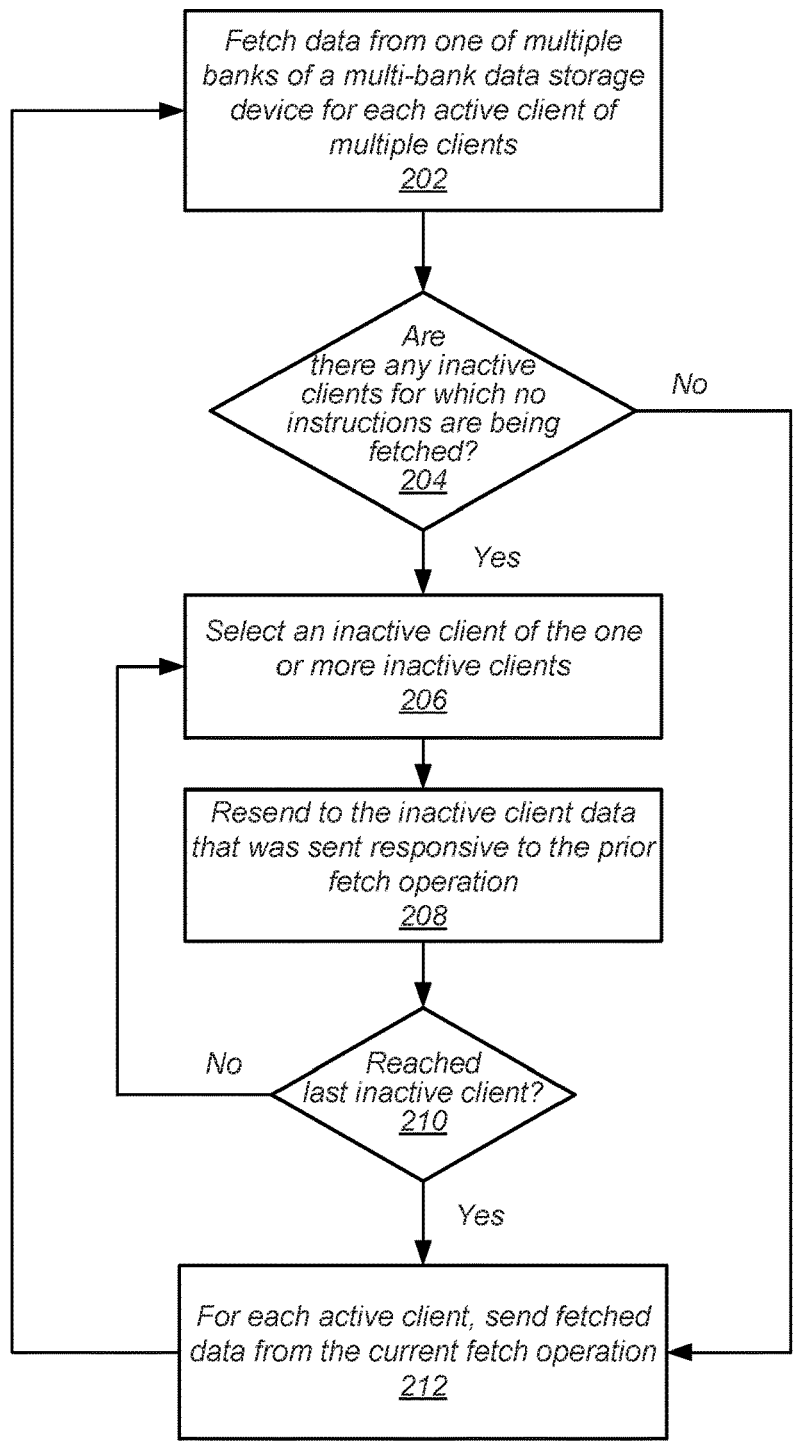
FIG. 2 is a flow diagram of one embodiment of a method for efficiently reducing power consumption in a crossbar of a computing system.

Referring now to FIG. 2, one embodiment of a method 200 for efficiently reducing power consumption in a crossbar of a computing system is shown. For purposes of discussion, the steps in this embodiment (as well as in FIG. 3) are shown in sequential order. However, it is noted that in various embodiments of the described methods, one or more of the elements described are performed concurrently, in a different order than shown, or are omitted entirely. Other additional elements are also performed as desired. Any of the various systems or apparatuses described herein are configured to implement method 200 (as well as method 300).

A data storage device controller fetches data from one of multiple banks of a multi-bank data storage device for each active client of multiple clients (block 202). In some designs, the data storage device is a multi-banked instruction cache, and each client is one of a variety of processing units. For example, in an embodiment, each of the multiple clients is a compute unit in a GPU. A data transfer crossbar (or crossbar) transfers instructions and data between the multi-banked data storage device and the multiple clients. In some designs, each of the multiple clients is capable of requesting data from any one of the multiple banks in the multi-banked data storage device.

As used herein, a fetch operation is performed for the data storage device responsive to the data storage device receives a read request from a client targeting the data storage device. In various embodiments, each read request from a client includes a bank identifier that identifies from which bank of the data storage device to retrieve requested data. In various embodiments, when a client is inactive, the crossbar uses a bank identifier that indicates the inactive status of the client, rather than identifies a particular bank. As described earlier, in some embodiments, selection logic in the crossbar uses a one-hot mask for selecting data to place on data lines conveyed to the client. In an embodiment, this one-hot mask has all zeroes when the client is inactive.

A software source or a hardware source schedules instructions or commands to be executing on the clients. In one example, one or more of an operating system scheduler and a command processor in a GPU schedules commands on the compute units of the GPU. When a given compute unit has no scheduled work, in some designs, a power management unit power gates the compute unit by disabling clock signals for the given compute unit. The given compute unit is considered to be inactive.

If there are any inactive clients for which no data are being fetched ("yes" branch of the conditional block 204), then logic in the crossbar selects an inactive client of the one or more inactive clients (block 206). The logic resends to the inactive client data that was sent responsive to a prior fetch operation (block 208). Therefore, the data lines for the fetched data do not transition for each inactive clock cycle after the most recent clock cycle when the selected client was active. In fact, the data lines for the fetched data do not transition for as many clock cycles as the given client remains inactive. Accordingly, the crossbar reduces its power consumption.

If the most recent inactive client has not been reached ("no" branch of the conditional block 210), then control of method 200 returns to block 206 where logic in the crossbar selects an inactive client of the one or more inactive clients. If the last inactive client has been reached ("yes" branch of the conditional block 210), then for each active client, the logic of the crossbar sends fetched data from the current fetch operation to the active client (block 212). Similarly, if there are not any inactive clients for which no instructions are being fetched ("no" branch of the conditional block 204), then control flow of method 200 moves to block 212. Afterward, control flow of method 200 returns to block 202 where the data storage device controller fetches data from one of multiple banks of a multi-bank data storage device for each active client of multiple clients.

Figure 3:
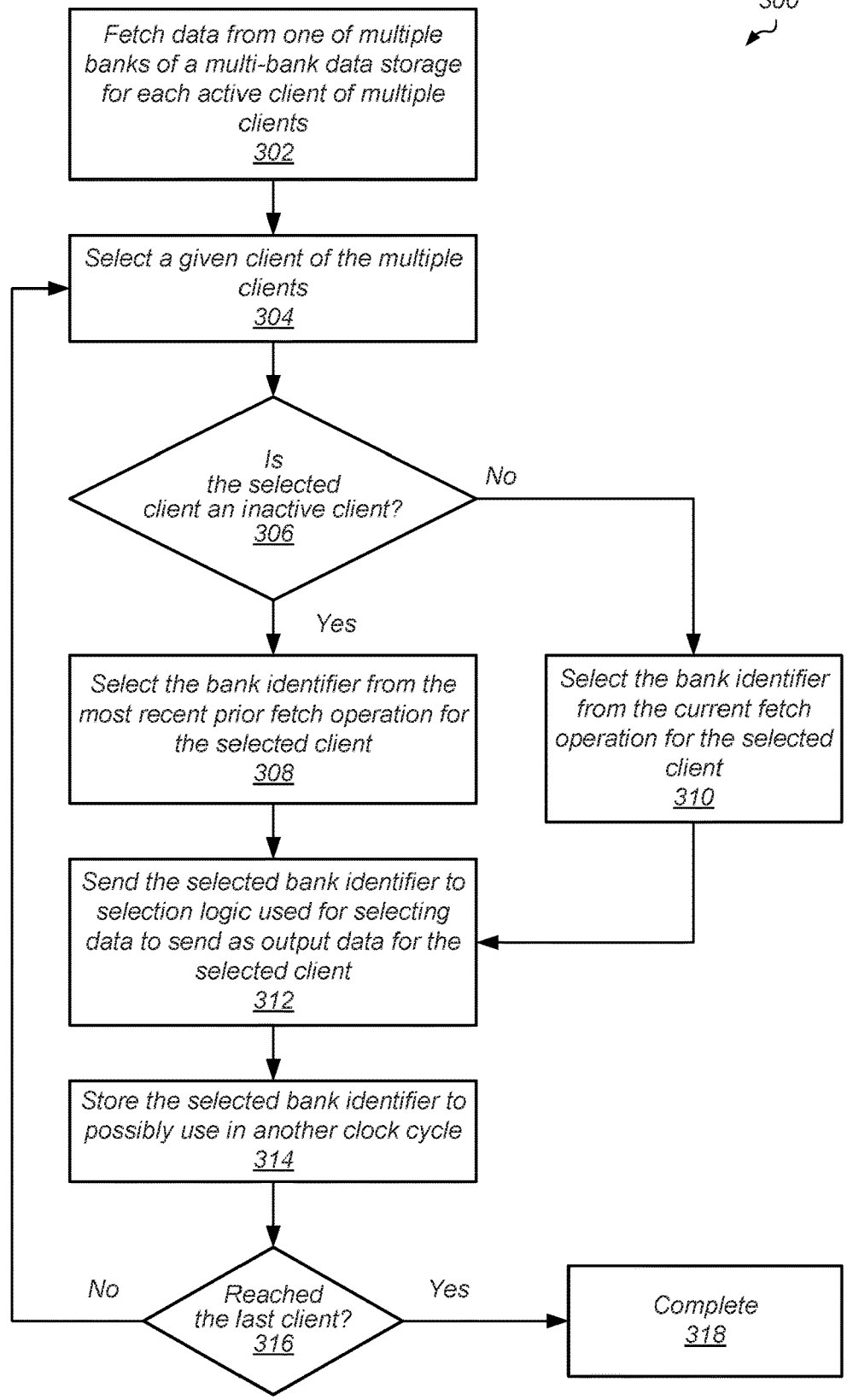
FIG. 3 is a flow diagram of one embodiment of a method for efficiently reducing power consumption in a crossbar of a computing system.

Referring now to FIG. 3, one embodiment of a method 300 for efficiently reducing power consumption in a crossbar of a computing system is shown. A data storage device controller fetches data from one of multiple banks of a multi-bank data storage device for each active client of multiple clients (block 302). Any one of the examples for the data storage device and the clients previously described are used. A crossbar transfers instructions and data between the multi-banked data storage device and the multiple clients. In some designs, each of the multiple clients is capable of requesting data from any one of the multiple banks in the multi-banked data storage device.

Logic within the crossbar selects a client of the multiple clients (block 304). If the selected client is an inactive client ("yes" branch of the conditional block 306), then the logic selects the bank identifier from the most recent prior fetch operation for the selected client (block 308). For example, this bank identifier was previously stored. In such cases, the bank identifier matches a bank identifier of a most recent prior fetch operation. For example, the values for each of the bank identifiers are the same. Referring briefly again to FIG. 1, the value for bank select0 172 matches a bank identifier of a most recent prior fetch operation. If the selected client is an active client ("no" branch of the conditional block 306), then the logic selects the bank identifier from the current fetch operation for the selected client (block 310). Therefore, the selected bank identifier matches the bank identifier of a current fetch operation. In the earlier example for the crossbar 100 (of FIG. 1), the mux 170 selects one of multiple bank identifiers. Accordingly, bank select0 172 matches select0 122.

Logic in the crossbar sends the selected bank identifier to selection or routing logic used for selecting data to send as output data for the selected client (block 312). In the earlier example for the crossbar 100 (of FIG. 1), the mux 170 selected one of multiple bank identifiers to send as select lines to the mux 130. The logic stores the selected bank identifier for possible use in another clock cycle (block 314). In the earlier example for the crossbar 100 (of FIG. 1), the mux 150 selected one of multiple bank identifiers to send to the sequential element 160 for storage. If the most recent client is not reached ("no" branch of the conditional block 316), then control flow of method 300 returns to block 304 where logic within the crossbar selects a client of the multiple clients. However, if the most recent client is reached ("yes" branch of the conditional block 316), then control flow of method 300 moves to block 318 where method 300 completes.

Figure 4:
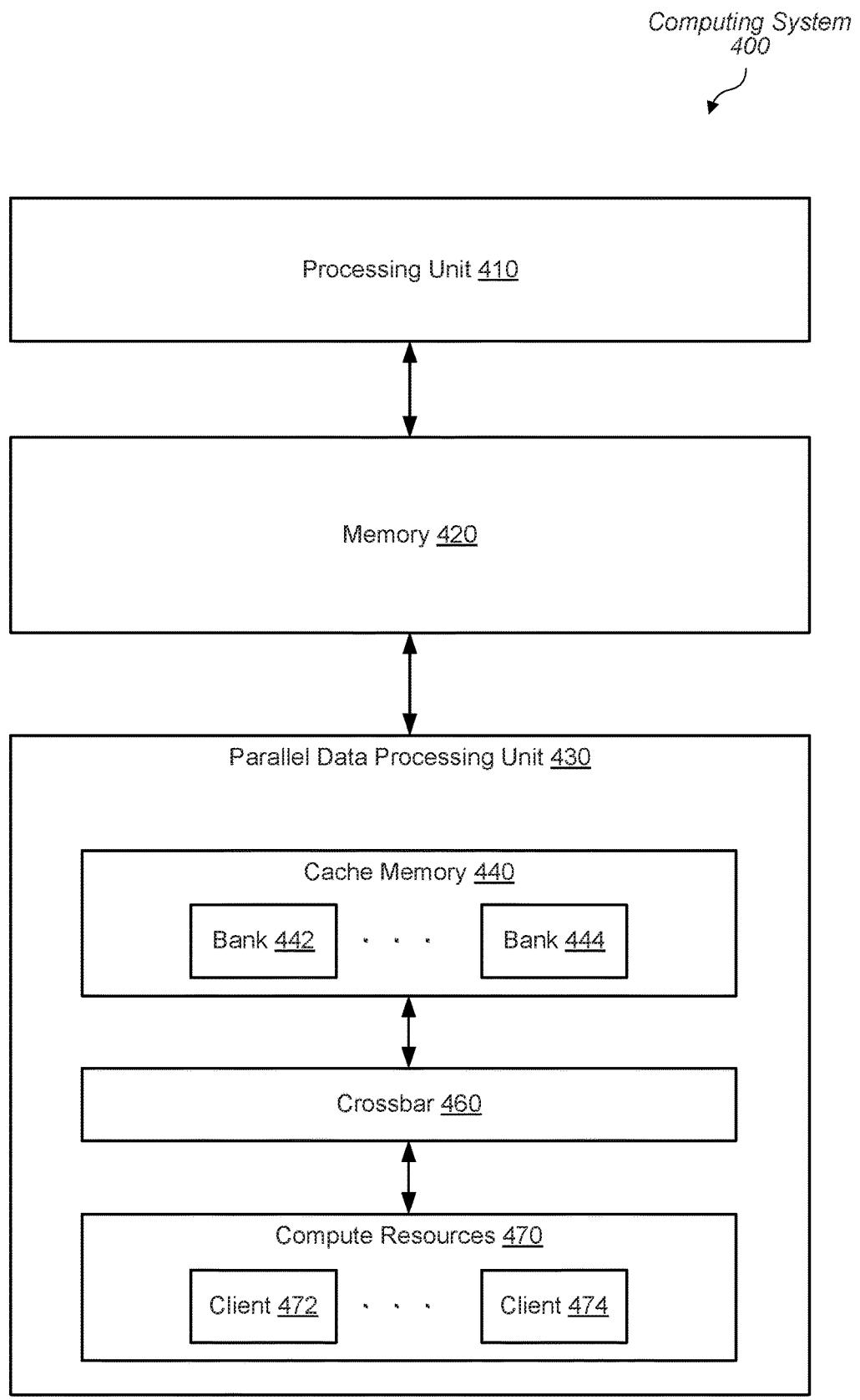
FIG. 4 is a block diagram of another embodiment of a computing system.

Turning now to FIG. 4, one embodiment of a computing system 400 is shown. As shown, the computing system 400 includes a processing unit 410, a memory 420 and a parallel data processing unit 430. In some designs, the functionality of the computing system 400 is included as components on a single die, such as a single integrated circuit. In other designs, the functionality of the computing system 400 is included as multiple dies on a system-on-a-chip (SOC). The computing system 400 is used in one or more of a desktop, a portable computer, a mobile device, a server, a peripheral device, or other. Although a network interface is not shown, in some designs, remote programmers use one or more of the processing unit 410 and the parallel data processing unit 430 in a cloud-computing environment. For example, cloud service providers sell the use of the compute resources 470 of the parallel data processing unit 430 as a service.

The processing unit 410 processes instructions of a predetermined algorithm. The processing includes fetching instructions and data, decoding instructions, executing instructions and storing results. In one embodiment, the processing unit 410 is a general-purpose central processing units (CPUs) and uses one or more processor cores with circuitry for executing instructions according to one of a variety of predefined general-purpose instruction sets. In various embodiments, the parallel data processing unit 430 uses a data parallel micro-architecture that provides high instruction throughput for a computational intensive task. In one embodiment, the parallel data processing unit 430 uses one or more processor cores with a relatively wide single instruction multiple data (SIMD) micro-architecture to achieve high throughput in highly data parallel applications. Each object is processed independently of other objects, but the same sequence of operations is used.

In one embodiment, the parallel data processing unit 430 is a graphics processing unit (GPU). An operating system scheduler (not shown) schedules threads on one of the processing unit 410 and the parallel data processing unit 430 in a manner that each thread has the highest instruction throughput based at least in part on the algorithm using the threads and runtime hardware resources of the processing unit 410 and the parallel data processing unit 430.

While processing instructions or translated commands, each of the processing unit 410 and the parallel data processing unit 430 performs calculations and generates memory access requests for storing result data and for retrieving instructions and operand data. In addition to using local memory within a processing unit, each of the processing unit 410 and the parallel data processing unit 430 accesses the memory 420. The memory 420 is any suitable memory device. Examples of the memory devices are RAM-BUS dynamic random access memories (DRAMs), synchronous DRAMs (SDRAMs), DRAM, static RAM, three-dimensional (3D) integrated DRAM, etc.

In some embodiments, the address space of the computing system 400 is divided among the processing unit 410 and the parallel data processing unit 430 with a portion shared among them. Each one of the processing units 410 and 430 uses a respective memory map for determining which addresses are mapped to it, and hence to which one of the processing units 410 and 430 a memory request for a particular address should be routed.

The compute resources 470 uses multiple clients 472-474, each with multiple lanes. Each lane is also referred to as a SIMD unit or a SIMD lane. In various designs, the lanes operate in lockstep. Although two clients are shown, the computing resources 470 use any number of clients. Each of the clients 472-474 share the cache memory 440. In some designs, the cache memory 440 includes both an instruction cache and a data cache. In other designs, the cache memory 440 is representative of one of the instruction cache and the data cache. The cache memory 440 is partitioned into banks 442 and 444. Although two banks are shown, the cache memory 440 uses any number of banks.

Crossbar 460 transfers instructions and data between the banks 442-444 of the cache memory 440 and the clients 472-474 of the computing resources 470. In various embodiments, crossbar 460 is equivalent to crossbar 100 (of FIG. 1). Therefore, when client 472 is inactive, the data lines in crossbar 460 for fetched data corresponding to client 472 do not transition for each inactive clock cycle after the most recent active clock cycle for client 472. In fact, the data lines for the fetched data do not transition for as many clock cycles as the client 472 remains inactive.

Figure 5:
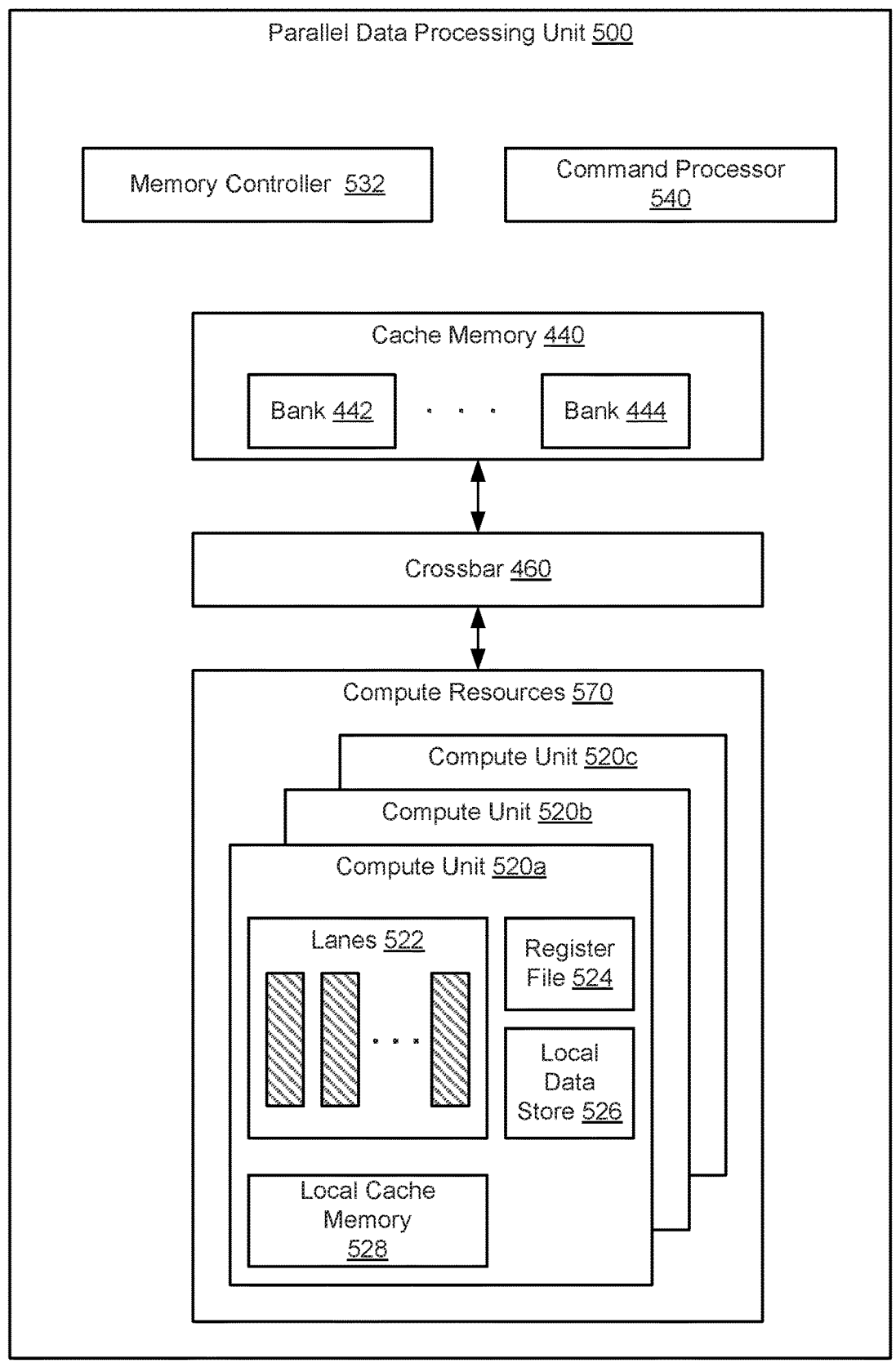
FIG. 5 is a block diagram of one embodiment of a parallel data processing unit.

Turning now to FIG. 5, one embodiment of a parallel data processing unit 500 is shown. Circuitry and logic previously described are numbered identically. Although an example of a single instruction multiple data (SIMD) micro-architecture is shown for the parallel data processing unit 500, other types of highly parallel data micro-architectures are possible and contemplated. The parallel data processing unit 500 uses a memory controller 532, a command processor 540, cache memory 440, crossbar 460 and compute resources 570.

The compute resources 570 includes the multiple compute units 520*a*-520*c*, each with multiple lanes 522, which are also referred to as SIMD units or SIMD lanes. The lanes 522 operate in lockstep. As shown, each of the compute units 520*a*-520*c* uses a respective register file 524, a local data store 526 and a local cache memory 528. In some embodiments, the local data store 526 is shared among the lanes 522 within each of the compute units 520*a*-520*c*. In other embodiments, a local data store is shared among the compute units 520*a*-520*c*. Therefore, it is possible for one or more of lanes 522 within the compute unit 520*a* to share result data with one or more lanes 522 within the compute unit 520*b* based on an operating mode.

The memory controller 532 uses combinatorial logic and sequential elements for supporting communication protocols with off-chip memory. The command processor 540 uses interfaces to the memory controller 532 for accessing commands stored on the off-chip memory. A control unit within the command processor 540 schedules the retrieved commands on the compute units 520*a*-520*c* of the computing resources 570. The compute resources 570 generate result data when processing the scheduled commands, and the command processor 540 sends the result data to the off-chip memory.

The data flow within each of the lanes 522 is pipelined. Pipeline registers store intermediate results and circuitry for arithmetic logic units (ALUs) perform integer arithmetic, floating-point arithmetic, Boolean logic operations, branch condition comparisons and so forth. These components are not shown for ease of illustration. Each of the computation units within a given row across the lanes 522 is the same computation unit. Each of these computation units operates on a same instruction, but different data associated with a different thread.

Each of the compute units 520*a*-520*c* accesses one of the banks 442-444 of the cache memory 440 for instructions. In some designs, the cache memory 440 also stores operand data to load into the register files 524. In some embodiments, an operating system (OS) scheduler or a user-level scheduler schedules workloads on the parallel data processing unit 500 using a variety of schemes such as a round-robin scheme, a priority scheme, an availability scheme or a combination. Alternatively, a programmer schedules the workloads in combination with the runtime system. In such a case, the programmer utilizes a software platform to perform the scheduling. The computer program in the chosen higher-level language is partially processed with the aid of graphic libraries with their own application program interfaces (APIs). Platforms such as OpenCL (Open Computing Language), OpenGL (Open Graphics Library) and OpenGL for Embedded Systems (OpenGL ES), are used for running programs on GPUs from AMD, Inc. Additionally, CUDA is a platform for running programs on GPUs from NVidia Corp. In some embodiments, developers use OpenCL for simultaneously processing the multiple data elements of the scientific, medical, finance, encryption/decryption and other computations while using OpenGL and OpenGL ES for simultaneously rendering multiple pixels for video graphics computations. Further, DirectX is a platform for running programs on GPUs in systems using one of a variety of Microsoft operating systems.

In various embodiments, program instructions of a software application are used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computing system during use to provide the program instructions and accompanying data to the computing system for program execution. The computing system includes at least one or more memories and one or more processors that execute program instructions.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
    a first interface configured to receive data fetched from one of a plurality of banks of a data storage device;
    a second interface configured to send data fetched from the data storage device to a plurality of clients; and
    logic configured to send, via the second interface, data to a given client of the plurality of clients, wherein the data is from a bank of the data storage device identified by a bank identifier;
    wherein when the given client is an active client, the bank identifier matches a bank identifier of a first fetch operation; and
    wherein when the given client is an inactive client:
        the bank identifier matches a bank identifier of a second fetch operation, wherein the second fetch operation is a fetch operation prior to the first fetch operation; and
        the logic resends, to the inactive client, data that was sent responsive to the second fetch operation.

2. The apparatus as recited in claim 1, wherein when the given client is an inactive client, the logic receives select lines indicating the given client is an inactive client without identifying any bank in the data storage device.

3. The apparatus as recited in claim 2, wherein the logic is further configured to send the bank identifier to selection logic used for selecting data to send to the given client.

4. The apparatus as recited in claim 2, wherein the logic is further configured to store the bank identifier for use in another clock cycle.

5. The apparatus as recited in claim 2, wherein in further response to determining the given client is an active client for which data is being fetched, the logic is further configured to:
    select the bank identifier from the first fetch operation for the given client; and
    store the selected bank identifier for use in another clock cycle.

6. The apparatus as recited in claim 2, wherein in further response to determining the given client is an inactive client, the logic is further configured to retrieve a previously stored bank identifier.

7. The apparatus as recited in claim 1, wherein the data are instructions of a single instruction multiple data (SIMD) computer program.

8. A method, comprising:
    receiving, by logic of a crossbar, data fetched from one of a plurality of banks of a data storage device;
    sending, by the logic, data to a given client of the plurality of clients, wherein the data is from a bank of the data storage device identified by a bank identifier;
    wherein when the given client is an active client, the bank identifier matches a bank identifier of a first fetch operation; and
    wherein when the given client is an inactive client:
        the bank identifier matches a bank identifier of a second fetch operation, wherein the second fetch operation is a fetch operation prior to the first fetch operation; and
        the logic resends, to the inactive client, data that was sent responsive to the second fetch operation.

9. The method as recited in claim 8, wherein when the given client is an inactive client, the logic receives select lines indicating the given client is an inactive client without identifying any bank in the data storage device.

10. The method as recited in claim 9, further comprising sending the bank identifier to selection logic used for selecting data to send to the given client.

11. The method as recited in claim 9, further comprising storing the bank identifier for use in another clock cycle.

12. The method as recited in claim 9, wherein in further response to determining the given client is an active client for which data is being fetched, the method further comprises:
    selecting the bank identifier from the first fetch operation for the given client; and
    storing the selected bank identifier for use in another clock cycle.

13. The method as recited in claim 9, wherein in further response to determining the given client is an inactive client, the method further comprises retrieving a previously stored bank identifier.

14. The method as recited in claim 8, wherein the data are instructions of a single instruction multiple data (SIMD) computer program.

15. A non-transitory computer readable storage medium storing program instructions, wherein the program instructions are executable by a processor to:
    receive data fetched from one of a plurality of banks of a data storage device;

send data to a given client of the plurality of clients, wherein the data is from a bank of the data storage device identified by a bank identifier;

wherein when the given client is an active client, the bank identifier matches a bank identifier of a first fetch operation; and wherein when the given client is an inactive client:

the bank identifier matches a bank identifier of a second fetch operation, wherein the second fetch operation is a fetch operation prior to the first fetch operation; and the logic resends, to the inactive client, data that was sent responsive to the second fetch operation.

16. The non-transitory computer readable storage medium as recited in claim 15, wherein when the given client is an inactive client, the logic receives select lines indicating the given client is an inactive client without identifying any bank in the data storage device.

17. The non-transitory computer readable storage medium as recited in claim 16, wherein the program instructions are further executable by a processor to send the bank identifier to selection logic used for selecting data to send to the given client.

18. The non-transitory computer readable storage medium as recited in claim 16, wherein the program instructions are executable by a processor to store the bank identifier for use in another clock cycle.

19. The non-transitory computer readable storage medium as recited in claim 16, wherein in further response to determining the given client is an active client for which data is being fetched, the program instructions are executable by a processor to:

select the bank identifier from the first fetch operation for the given client; and store the selected bank identifier for use in another clock cycle.

20. The non-transitory computer readable storage medium as recited in claim 16, wherein in further response to determining the given client is an inactive client, the program instructions are executable by a processor to retrieve a previously stored bank identifier.

* * * * *